(12) United States Patent
Shevy et al.

(10) Patent No.: US 6,483,956 B1
(45) Date of Patent: Nov. 19, 2002

(54) FIBER FREQUENCY LOCKER

(75) Inventors: Yaakov Shevy, Pasadena, CA (US); Amnon Yariv, Pasadena, CA (US); Dan Provenzano, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/637,480

(22) Filed: Aug. 11, 2000

Related U.S. Application Data

(60) Provisional application No. 60/149,004, filed on Aug. 13, 1999.

(51) Int. Cl.[7] .............................. G02B 6/00; H01S 3/13
(52) U.S. Cl. ................ 385/11; 372/29.011; 372/29.02; 372/32; 372/20
(58) Field of Search .......................... 372/6, 20, 29.011, 372/32, 29.02; 385/10, 11, 16, 37; 359/156, 157, 187, 188

(56) References Cited

U.S. PATENT DOCUMENTS

| | | | |
|---|---|---|---|
| 4,547,664 A | * 10/1985 | Vogt et al. | .................. 250/205 |
| 5,107,512 A | * 4/1992 | Shibutani | ..................... 372/32 |
| 5,396,361 A | 3/1995 | Sasaki et al. | |
| 5,428,700 A | 6/1995 | Hall | |
| 5,511,083 A | 4/1996 | D'Amato et al. | |
| 5,561,675 A | * 10/1996 | Bayon et al. | .................. 372/6 |
| 6,009,111 A | 12/1999 | Corwin et al. | |

* cited by examiner

Primary Examiner—Hemang Sanghavi
Assistant Examiner—Omar Rojas
(74) Attorney, Agent, or Firm—Fish & Richardson P.C.

(57) ABSTRACT

Techniques and devices using a fiber cavity formed of two spaced fiber gratings to construct a laser frequency locker.

24 Claims, 2 Drawing Sheets

FIBER FREQUENCY LOCKER

RELATED PATENT APPLICATIONS

This application claims the benefit of U.S. Provisional Application No. 60/149,004, filed Aug. 13, 1999.

ORIGIN OF THE INVENTION

The U.S. Government has certain rights in this invention pursuant to Grant No. ESC 9806922 awarded by the National Science Foundation.

BACKGROUND

This application relates to optical fiber devices and lasers.

The output frequency of a laser can drift or fluctuate due to various internal processes (e.g., shot noise and other fluctuations) or environmental factors (e.g., a change in temperature or vibrations). The frequency of a semiconductor laser, for example, can change with the electric driving current and temperature. Such variations in the laser frequency are undesirable in certain applications where the frequency stability is required.

For example, wavelength-division-multiplexing (WDM) has been used to expand the capacity of a fiber communication link by simultaneously transmitting different optical waves at different wavelengths. It is critically important to specify and standardize the wavelengths in WDM signals so that WDM devices, modules, and subsystems from different manufactures are compatible and can be integrated and deployed in commercial WDM networks. One commonly-used WDM wavelength standard is the International Telecommunication Union (ITU) standard, where the WDM wavelengths of different optical waves are required to match ITU grid frequencies. Hence, the laser transmitters for the different WDM channels need be stabilized against wavelength instability caused by either internal or external fluctuations.

Other applications, such as precision spectroscopic measurements and nonlinear optical processes, may also require frequency stabilization of lasers.

SUMMARY

This application includes techniques and devices that use optical fibers and fiber devices to stabilize the frequency of a laser.

DESCRIPTION OF DRAWINGS

Like reference symbols in the various drawings indicate like elements.

DETAILED DESCRIPTION

Figure 1:
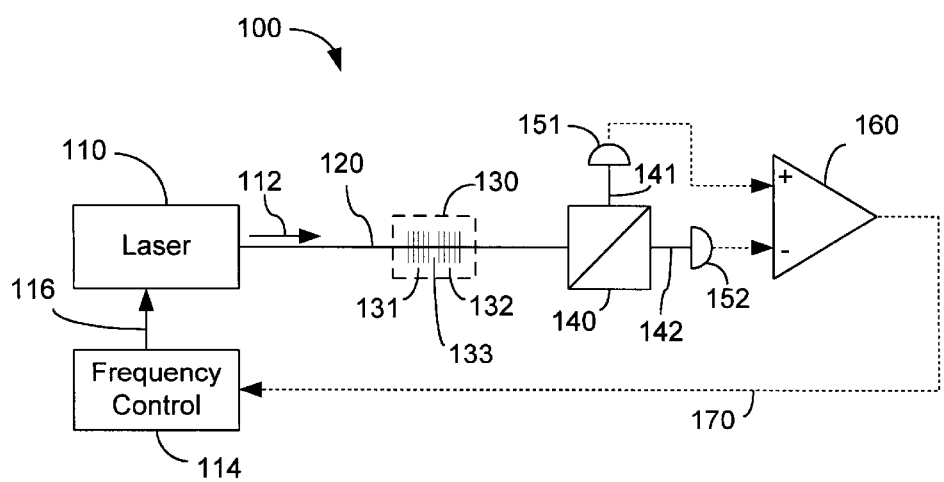
FIG. 1 shows one embodiment of a laser frequency locker based on polarization mode dispersion in a fiber cavity formed of two sets of fiber gratings in a fiber.

FIG. 1 shows one embodiment of a fiber-based frequency locker 100. A laser 110 is optically coupled to a fiber 120 so that the output laser beam 112 is confined and guided within the fiber 120. The fiber 112 is designed to be anisotropic so that the index of refraction for an optical polarization along a selected direction perpendicular to the fiber core is different from that for another optical polarization perpendicular to the selected direction. For example, a polarization-preserving fiber with such anisotropy in the index can be used as the fiber 120. One way to achieve this anisotropy in the index of refraction is to mechanically stress the fiber 122 along the selected direction that is substantially perpendicular to the fiber axis. In another method, the fiber core is exposed to UV light to create the desired birefringence in the fiber core. Furthermore, a birefringent dielectric material may be used to form the fiber core.

The fiber 120 includes a segment 130 in which two sets of Bragg gratings 131 and 132 with substantially the same grating period are formed in the fiber and are spaced from each other by a gap 133. Each fiber grating operates as a reflector to selectively reflect light at a Bragg wavelength that satisfies the Bragg phase matching condition and to transmit other spectral components. This Bragg wavelength is equal to twice of the product of the effective index of the refraction of the fiber and grating period. Since both gratings 131 and 132 have the same grating period, they are reflective at the same wavelength. The reflection of the gratings 131 and 132 is not limited to a single wavelength but rather has a reflection bandwidth where each grating is reflective to light at any wavelength within the bandwidth. The reflection bandwidth of each grating is a function of the grating strength which depends on the depth of the periodic modulation on the fiber's index of refraction and the number of periods in each grating. Hence, the two spaced gratings 131 and 132 form a Fabry-Perot cavity only for light at the Bragg wavelength.

Light at the Bragg wavelength in such a Fabry-Perot cavity 130 will be reflected by the gratings 131 and 132 to bounce back and forth to cause light interference. A constructive interference occurs to create a transmission peak at a resonance when the round-trip phase delay is 360 degrees or any multiple of 360 degrees. The optical transmission of the Fabry-Perot cavity 130 decays as the phase delay deviates from the resonance and becomes zero when the phase delay deviates from the resonance exactly by 180 degrees. As the phase delay continues to change, the optical transmission begins to increase and reaches the peak value when another resonance condition is met. This behavior is periodic with respect to the round-trip phase delay. This round-trip phase delay is essentially determined by the product of the effective index of refraction of the fiber and the gap 133 and a resonance peak occurs when the product is equals to one half of the wavelength. When expressed in frequency, the round-trip phase delay represents the frequency difference between two adjacent resonant peaks and is called the free spectral range (FSR) of the Fabry-Perot cavity.

Figure 2A:
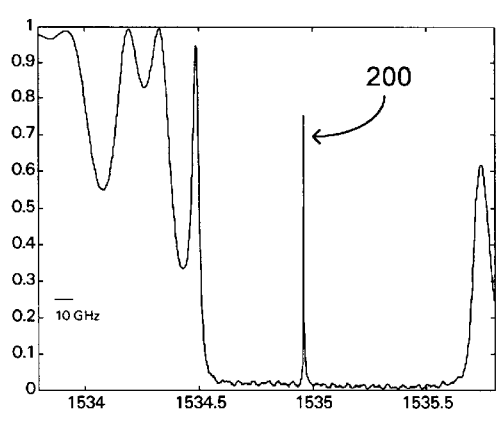
FIG. 2A shows transmission spectrum of a fiber Fabry-Perot resonator with two spaced fiber gratings in absence of polarization mode dispersion, where a single transmission peak appears near 1535 nm within the reflective bandwidth from about 1534.5 nm to about 1535.6 nm.

The Fabry-Perot cavity 130 can be configured to have only a single transmission peak within the reflection bandwidth by making the reflection bandwidth of the fiber gratings 131 and 132 less than FSR. FIG. 2A shows the transmission spectrum of an exemplary fiber Fabry-Perot cavity where each fiber grating is designed to be reflective in the bandwidth from about 1534.5 nm to about 1535.6 nm. In absence of the polarization mode dispersion, a single transmission peak 200 appears in the reflective bandwidth when the frequency of input light matches one of the resonance peaks of the fiber Fabry-Perot cavity.

When the finesse of the fiber Fabry-Perot cavity 120 is relatively high, e.g., by increasing each grating's strength, the linewidth of each transmission peak is narrow and thus the resonance frequency of the transmission peak is a well-defined frequency. Therefore, this resonance frequency can be used as a frequency reference or marker. Since the transmission of the input light changes when the input frequency drifts relative to the resonance frequency, a variation in the transmission intensity of the input light can be used to indicate the frequency shift of the input light with respect to the resonance frequency.

Notably, the index of the refraction of the fiber 122 is anisotropic. For input light at a fixed input frequency, the optical polarization parallel to the selected direction experiences one value for the index of refraction and the optical polarization perpendicular to the selected direction experiences a different value for the index of refraction. These two different index values along two orthogonal directions create a polarization mode dispersion between two orthogonal polarizations and respectively produce two closely spaced resonance peaks, one for each polarization. The frequency spacing between the two peaks is determined by the index difference in the gap 133.

Figure 2B:
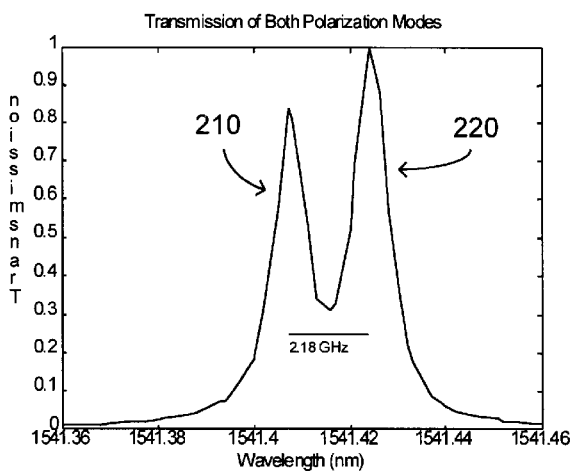
FIG. 2B shows an example of two closed spaced transmission peaks within the reflective bandwidth of a fiber Fabry-Perot resonator caused by splitting a single transmission peak due to the polarization mode dispersion in the system shown in FIG. 1.

FIG. 2B shows an example of two transmission peaks 210 and 220 near 1541.41 nm from the fiber cavity 130 formed of a polarization-preserving silicon glass fiber. The index difference between the two orthogonal polarizations makes the two polarizations to match the same resonance mode of the cavity at two different frequencies 210 and 220 that is about 2.18 GHz apart.

The system 100 is designed to use these two peaks along two orthogonal polarizations at the same resonance mode to create an error signal that indicates a variation in the laser frequency and to use a feedback mechanism to correct the laser frequency based on the error signal.

The fiber gratings 131 and 132 are designed so that their reflective bandwidth covers a spectral range in which the frequency of the laser 110 is to be stabilized. The polarization of the output laser beam 112 and the selected direction of the fiber 120 are oriented at about 45 degrees relative to each other so that the input laser power is essentially equally divided between two orthogonal polarizations, one parallel to the selected axis and another perpendicular to the selected axis. A polarization device 140 is coupled to the fiber 120 to receive the transmission from the fiber cavity 130. Examples of such device 140 include, among others, a polarization beam splitter and a polarizing fiber coupler. In operation, the device 140 is oriented to separate the polarization along the selected direction to be a first output signal 141 from another polarization perpendicular to the selected direction which is a second output signal 142. Two light detectors 151 and 152 are used to respectively receive and convert the signals 141 and 142 into electrical output signals.

An electronic circuit 160 is coupled to receive the output signals from the detectors 151 and 152. One of the two signals 151 and 152 (e.g., 152 which representing the peak 220 in FIG. 2) is inverted by the circuit 160 and is then added to another signal to produce a sum signal. The sum signal may be subsequently amplified for further processing.

As illustrated, the circuit 160 may include an operational amplifier to perform the inverting, summing, and amplifying steps.

Figure 3:
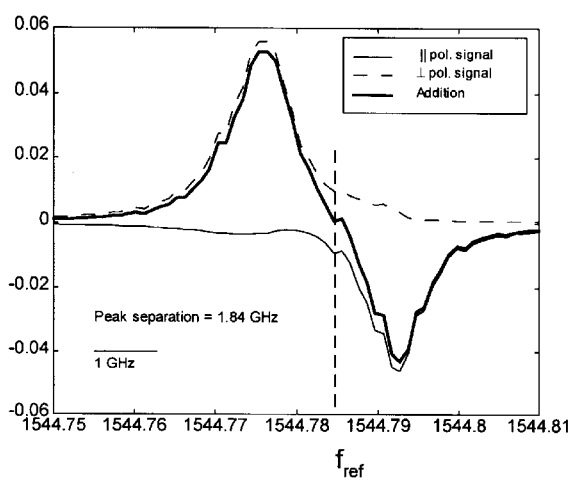
FIG. 3 shows an exemplary error signal produced by an implementation of the system shown in FIG. 1.

FIG. 3 shows one example of the above sum signal as a spectral dispersive line shape for a laser wavelength at about 1544.78 nm. The two peaks from the fiber Fabry-Perot cavity due to the anisotropy along two orthogonal polarizations are about 1.84 GHz apart from each other. When the polarization of the laser beam 112 is exactly 45 degrees with respect to the selected direction of the fiber 120, the two peaks are essentially identical in spectral profile and strength but are spectrally shifted from each other. Hence, the sum signal goes to zero at the center frequency between the two peaks and becomes either positive or negative when the laser frequency deviates from that center frequency. This center frequency can be used as a frequency reference ($f_{ref}$) to which the laser frequency is locked.

The fiber cavity 130 can be designed to set the frequency reference at a desired value by controlling, e.g., anisotropy in the index of the fiber 120, the structure of the gratings 131 and 132 and the gap 133. For WDM applications, for example, the frequency reference may be one of the WDM wavelengths specified by the ITU standard.

Referring back to FIG. 1, an error signal 170 may be a voltage or current signal from the circuit 160 that represents the sign and magnitude of the sum signal. The error signal 170 is then fed back to the laser 110 to form a servo control feedback loop. The servo loop, in response to the error signal 170, operates to adjust the frequency of the laser 110 towards the frequency reference so that the magnitude of the error signal 170 is reduced within an acceptable range and hence the laser frequency stays "locked" at the frequency reference. The sign of the error signal 170 dictates the direction of the correction to the laser frequency and the magnitude determines the amount of the correction to the laser frequency.

The laser 110 in general may be any tunable laser whose output frequency can be controlled by a signal 116 from a frequency control unit 114. For example, the laser 110 may include a semiconductor laser, a fiber laser with either a linear or ring cavity, or a laser based on a semiconductor or fiber laser. The frequency control unit 114 may be an internal part of the laser 110 or a device external to the laser 110. For example, if the laser 110 is a semiconductor diode laser, the frequency control 114 may be the driving circuit and the control signal 116 may be the driving current to the diode. Alternatively, the frequency control 114 may be a temperature controller that controls the temperature of the diode. If the laser 110 includes a fiber as part of the optical path, the frequency control unit 114 may include a fiber stretcher that controls the fiber length and hence the laser frequency.

Figure 4:
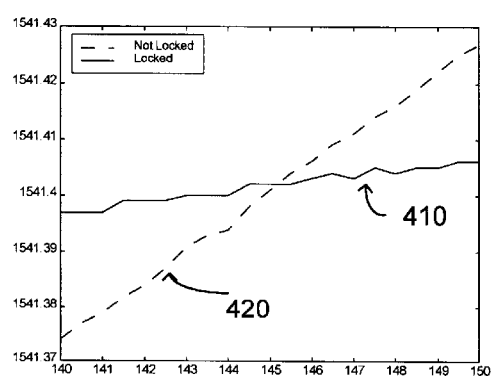
FIG. 4 shows measured laser frequency as a function of injection current to a diode laser with and without a frequency control shown in FIG. 1.

FIG. 4 shows measured laser wavelength as a function of the injection current to a laser diode with and without the servo control as shown in FIG. 1. Curve 410 shows the measured data when the frequency servo control is in operation. In comparison, curve 420 shows the measured data when the frequency servo control is turned off. The measurements indicate that the servo control improves the frequency stability of the diode laser by one order of magnitude. Higher stability can be obtained with higher servo loop gain.

Figure 5:
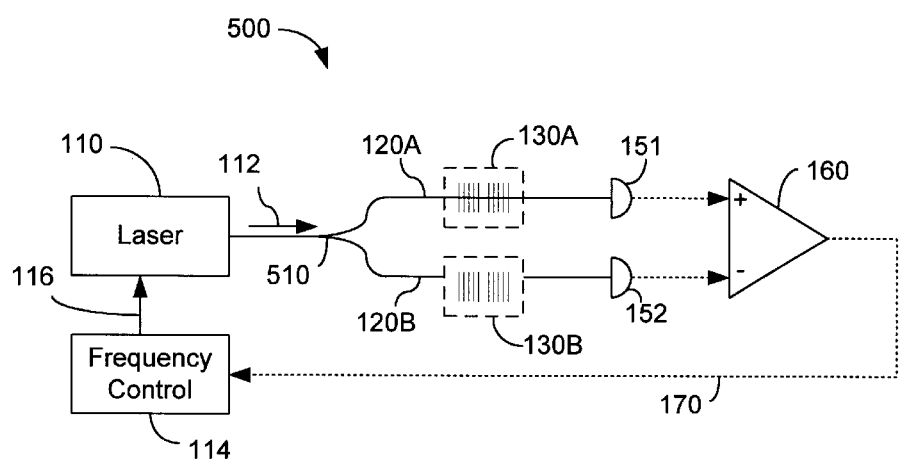
FIG. 5 shows another example of a laser frequency locker based on two fiber cavities formed in two separate fibers.

FIG. 5 shows another frequency servo control system 500 by using two fiber cavities 130A and 130B in two separate fibers 120A and 120B, respectively. A fiber coupler 510 may be used to divide the laser beam 112 into two equal beams and respectively couple the two beams into the fibers 120A and 120B. Unlike the fiber 120 used in the single fiber system 100, the two fibers 120A and 120B are not required to have two different indices for two orthogonal polarizations to create the closely spaced resonance peaks to match the same resonance cavity mode due to polarization mode dispersion. Instead, the two fiber cavities 130A and 130B are designed so that their resonance frequencies for the same order of the resonance are slightly shifted from each other by a desired amount. This may be achieved by, for example, configuring their gaps between the two gratings, or the grating periods, or both, to be different. In one implementation, the two fibers 120A and 120B may be placed under slightly different tensions to achieve the frequency shift between the two peaks.

The gap between the two fiber gratings in each fiber cavity is set sufficiently small that the FSR of the cavity is greater than the reflective bandwidth. Hence, only a single transmission resonance peak can appear within the reflective bandwidth for each fiber cavity. Like the polarization dispersion in the system 100 of FIG. 1, the center frequency between the two different transmission peaks from the two fiber cavities 130A and 130B can be used as a frequency reference to lock the laser 110. Detectors 151 and 152 are used to receive the signals for the two transmission peaks and the circuit 160 is used to invert one of the signals to produce the sum signal 170 as a feedback control.

In both systems 100 in FIG. 1 and 500 in FIG. 5, the frequency reference may be made adjustable so that the laser frequency, while being locked to the reference, can be tunable. For example, the two shifted resonance peaks in both systems may be shifted to change the center frequency. As long as the servo control operates properly, the laser 110 can be adjusted in response to the signal 116 to make the laser frequency to follow the center frequency.

In the system 100 in FIG. 1, this may be achieved by changing the grating spacing and the gap 133 between the two fiber gratings 131 and 132 so that both peaks shift by the same amount toward the same direction. A fiber stretcher may be engaged to the fiber 120 at the position of the cavity 130 to implement the tuning. In the system 500 in FIG. 5, one or both fibers 120A and 120B may be stretched to shift the center frequency between the two resonance peaks.

A number of embodiments have been described. Nevertheless, it will be understood that various modifications and enhancements may be made without departing from the spirit and scope of the following claims.

What is claimed is:

1. A device, comprising:
    a fiber, coupled to receive a laser beam at a laser frequency, having a fiber cavity formed of two sets of Bragg gratings that are spaced from each other and are reflective at said laser frequency, said fiber having a first index of refraction for an optical polarization along a first direction perpendicular to the fiber core and a second different index of refraction for an optical polarization along a second direction orthogonal to said first direction;
    a polarization element coupled to said fiber to receive a transmitted laser beam from said fiber cavity and to produce a first beam polarized along said first direction and a second polarized beam along said second direction;
    a first light detector to receive said first laser beam to produce a first detector signal;
    a second light detector to receive said second laser beam to produce a second detector signal; and
    an electronic circuit operable to combine said first and said second detector signals to produce an error signal indicative of a deviation of said laser frequency with respect to a reference frequency defined by said fiber cavity.

2. The device as in claim 1, wherein said laser beam is polarized along a direction that forms an angle of 45 degrees with respect to the first direction.

3. The device as in claim 1, wherein said fiber is a polarization-preserving fiber.

4. The device as in claim 1, wherein said fiber is mechanically stressed along one of said first and said second directions.

5. The device as in claim 1, wherein said fiber includes a birefringent dielectric material.

6. The device as in claim 1, wherein said electronic circuit includes a circuit element which inverts said first detector signal and then adds the inverted first detector signal to said second detector signal to produce said error signal.

7. The device as in claim 1, wherein said polarization element includes a polarization beam splitter.

8. The device as in claim 1, wherein said polarization element includes a polarizing fiber coupler.

9. The device as in claim 1, further comprising a laser operable to produce said laser beam.

10. The device as in claim 9, wherein said laser includes a semiconductor laser.

11. The device as in claim 9, wherein said laser includes a fiber as a port of a laser cavity of said laser.

12. The device as in claim 11, wherein said laser includes a ring cavity formed of said fiber.

13. The device as in claim 9, wherein said laser is operable to adjust said laser frequency of said laser beam in response to said error signal to stabilize said laser frequency relative to said reference frequency.

14. The device as in claim 1, further comprising an element engaged to control said fiber cavity so as to vary said reference frequency.

15. A device, comprising:
    a fiber coupler to receive a laser beam at a laser frequency and to split said laser beam into a first laser beam and a second laser beam;
    a first fiber, coupled to receive said first laser beam, having a first fiber cavity formed of two sets of Bragg gratings that are spaced from each other and are reflective at said laser frequency;
    a second fiber, coupled to receive said second laser beam, having a second fiber cavity formed of two sets of Bragg gratings that are spaced from each other and are reflective at said laser frequency;
    a first light detector to receive a first transmission from said first fiber cavity to produce a first detector signal;
    a second light detector to receive a second transmission from said second fiber cavity to produce a second detector signal; and
    an electronic circuit operable to combine said first and said second detector signals to produce an error signal indicative of a deviation of said laser frequency with respect to a reference frequency defined by said fiber cavity.

16. The device as in claim 15, further comprising an element coupled to at least one of said first and said second fiber cavities to control and vary said reference frequency.

17. The device as in claim 16, wherein said element includes a fiber stretcher.

18. A method, comprising:

forming a fiber cavity in a fiber by fabricating two sets of Bragg gratings in the fiber that are spaced from each other;

making the fiber to have a first index of refraction for an optical polarization along a first direction perpendicular to the fiber core and a second different index of refraction for an optical polarization along a second direction orthogonal to said first direction;

coupling a laser beam at a laser frequency that falls within a reflection bandwidth of said Bragg gratings;

aligning the polarization of said laser beam to form an angle of 45 degrees with respect to said first direction;

producing two transmission peaks at two frequencies from the fiber cavity;

separately converting the transmission peaks into two signals;

inverting one of the two signals and adding the inverted signal to another signal to form an error signal that indicates a deviation of the laser frequency from a frequency reference centered between the two transmission peaks; and adjusting the laser frequency to reduce the error signal so that the laser frequency is stabilized relative to the frequency reference.

19. The method as in claim 18, further comprising changing the frequency reference, while maintaining the laser frequency relative to the frequency reference, to tune the laser frequency.

20. The method as in claim 19, wherein the frequency reference is changed by controlling the fiber cavity.

21. The method as in claim 18, wherein the spacing between the Bragg gratings of the fiber cavity is set at a value so that the free spectral range of the fiber cavity is greater than a reflective bandwidth of the Bragg gratings.

22. A method, comprising:

forming a first fiber cavity by fabricating two sets of Bragg gratings in a first fiber that are spaced from each other to produce a first transmission resonance peak;

forming a second fiber cavity by fabricating two sets of Bragg gratings in a second fiber that are spaced from each other to produce a second transmission resonance peak different from the first transmission resonance peak;

coupling a laser beam at a laser frequency that falls within a reflection bandwidth of the Bragg gratings in the first and second cavities;

separately converting the transmission peaks into two signals;

inverting one of the two signals and adding the inverted signal to another signal to form an error signal that indicates a deviation of the laser frequency from a frequency reference centered between the two transmission peaks; and adjusting the laser frequency to reduce the error signal so that the laser frequency is stabilized relative to the frequency reference.

23. The method as in claim 22, wherein each fiber cavity has a free spectral range greater than the reflection bandwidth of the Bragg gratings.

24. The method as in claim 22, further comprising changing the frequency reference, while stabilizing the laser frequency relative to the frequency reference, to tune the laser frequency.

* * * * *